United States Patent [19]
Rockoff

[11] Patent Number: 5,978,942
[45] Date of Patent: Nov. 2, 1999

[54] STAR-I: SCALABLE TESTER ARCHITECTURE WITH I-CACHED SIMD TECHNOLOGY

[75] Inventor: Todd E. Rockoff, San Jose, Calif.

[73] Assignee: Simd Solutions, Inc., San Jose, Calif.

[21] Appl. No.: 08/824,189

[22] Filed: Mar. 26, 1997

Related U.S. Application Data

[60] Provisional application No. 60/033,571, Dec. 19, 1996.

[51] Int. Cl.$^6$ .................................................. G01R 31/28
[52] U.S. Cl. .......................................................... 714/724
[58] Field of Search .............................. 371/22.1, 22.35, 371/22.36, 22.6, 27.5, 27.7; 395/183.19, 183.15; 364/488, 489, 550, 580; 324/158.1, 765; 714/5, 6, 11, 28, 43, 47, 731, 741, 742, 724

[56] References Cited

U.S. PATENT DOCUMENTS

| | | | |
|---|---|---|---|
| 5,381,421 | 1/1995 | Dickol et al. | 371/27 |
| 5,461,310 | 10/1995 | Cheung et al. | 324/158.1 |
| 5,477,139 | 12/1995 | West et al. | 324/158.1 |
| 5,499,248 | 3/1996 | Behrens et al. | 371/22.1 |
| 5,504,670 | 4/1996 | Barth et al. | 364/134 |
| 5,511,212 | 4/1996 | Rockoff | 395/800 |
| 5,579,251 | 11/1996 | Sato | 364/579 |
| 5,583,430 | 12/1996 | Dinteman | 324/158.1 |
| 5,604,751 | 2/1997 | Panis | 371/22.1 |
| 5,646,521 | 7/1997 | Rosenthal et al. | 324/158.1 |
| 5,673,272 | 9/1997 | Proskauer et al. | 371/22.1 |

OTHER PUBLICATIONS

Schoettmer and Minami, "Challenging the 'High Performance—High Cost' Paradigm in Test", International Test Conference Proceedings, pp. 870–879, 1995.

Alton, "TGEN: Flexible Timing Generator Architecture", International Test Conference Proceedings, pp. 439–443, 1992.

West and Napier, "Sequencer Per Pin™ Test System Architecture", International Test Conference Proceedings, pp. 355–361, 1990.

Lesmeister, "The Linear Array Systolic Tester (LAST)", International Test Conference Proceedings, pp. 543–549, 1989.

*Primary Examiner*—Robert W. Beausoliel, Jr.
*Assistant Examiner*—Nadeem Iqbal
*Attorney, Agent, or Firm*—Sterne, Kessler, Goldstein & Fox P.L.L.C.

[57] ABSTRACT

A semiconductor tester high-speed system with Single Instruction-stream Multiple Data-stream (SIMD) organization, incorporating an event generator array, a plurality of pin channels for connecting to a device under test (DUT), a reconfigurable allocation switch for assignment of event generators to individual DUT pin channel connections, multi-clocking, and SIMD instruction cache. The result is a tester digital system exhibiting a maximum ratio of performance to hardware cost.

50 Claims, 9 Drawing Sheets

STAR-I: SCALABLE TESTER ARCHITECTURE WITH I-CACHED SIMD TECHNOLOGY

This application claims the benefit of U.S. Provisional No. 60/033,571 filed Dec. 19, 1996.

BACKGROUND OF THE INVENTION

1. Field of the Invention

This invention relates to parallel computers, semiconductor test equipment, and in particular to the engineering of such equipment for use in production of semiconductor devices for purposes of design and quality control.

2. Description of the Related Art

The predominant application of test during chip production is to determine whether a processed die conforms to the chip designer's expectations of its functional and electrical performance. A tester is a piece of capital equipment that allows the chip maker perform this comparison at the "back end" of the semiconductor manufacturing pipeline.

During test, a chip is referred to as "device under test", or DUT. As is well known, such a chip has a plurality of electrical contact pins which serve as paths for input and output signals communicating with associated circuitry for controlling the chip and receiving responses therefrom. A tester studies a DUT by driving waveforms into its inputs while simultaneously observing its outputs during the test process. The requirements of a tester are stringent: A tester must be able to produce and measure waveforms whose transition rates are an order of magnitude greater than the DUT clock rate, and the tester must be able to accurately maintain timing precision that is an order of magnitude finer than the resolution of the DUT specifications.

The results of test are used in a variety of ways. During production, the observations of output waveforms are used to establish that there is an absence of electrical faults within the chip. In failure analysis, the tester may stimulate the chip in an indefinitely repeating pattern while engineers probe internal nodes. An individual input signal transition or output signal measurement during a test is called a "pin event" or simply an "event". For characterization of a recently designed chip, the tester varies the times at which events occur so as to measure setup and hold margins for input signals with respect to input latch-control signals and to measure propagation delays from inputs to outputs. During the chip's design phase, test results validate the principles of operation of key circuits.

The electrical characteristics generated for input waveforms and expected for output waveforms are created from the chip maker's voltage, current, and slew rate specifications. The collection of sub-circuits that produces input waveforms and measures output waveforms is a PE (Pin Electronics circuit) 80. PEs 80 are analog devices whose accuracy, flexibility, and power-bandwidth product are among the tester's key specifications. The internal design of the PEs 80 is outside the scope of this invention.

During a functional test, the sequence of logical states to be produced in an input waveform or expected to be present in an output waveform is created algorithmically from a test program. The heart of a modern tester is a digital system 10 that generates a sequence of events for every DUT pin. A drive event on a pin directs that pin's PE driver to change the input waveform. A strobe event on a pin is a measurement of the pin's logical value as translated from its electrical value by the pin's PE comparator. Each drive event consists of a precisely timed change in the control signals going to the PEs, and each strobe event is a precisely timed measurement of the pin's output level against expectation.

The digital representation of an event specifies a type and a time. The event type is typically a short code word that names one of the possible events. Some example events are "drive input to logic 0", "stop driving input", "check output for logic 1", and "stop checking output". The event time is typically specified as an integer multiple of some predetermined time interval. Each digitally coded event is translated to an event that occurs close to the specified time. The tester's guaranteed closeness to the specified event time, known as the "edge placement accuracy", is among the tester's key specifications.

It is not widely acknowledged among tester designers that in producing a sequence of events on each DUT pin, the tester digital system 10 performs what parallel computer engineers would recognize as an archetypal scalable data-parallel computation. The portion of a tester's manufacturing cost represented by this digital system 10 has grown over the last 25 years to approximately 60%, and signs are that that portion will continue to increase as provision is made for per-pin APG (Algorithmic Pattern Generation) or DSP (Digital Signal Processing). With the advent in 1982 of IBM's Tester-per-Pin architecture, and its subsequent adoption in some form by nearly every tester manufacturer, the digital systems of testers have become very similar to SIMD (Single Instruction-Stream/Multiple Data-Stream) computers.

This application incorporates by reference the disclosure of my patent called "I-Cached SIMD" (U.S. Pat. No. 5,511,212, issued Apr. 23, 1996, Multi-Clock SIMD Computer and Instruction-Cache-Enhancement Thereof). That invention relates to Single Instruction-stream Multiple Data-stream (SIMD) computer architecture. A SIMD computer typically comprises one or more single-chip Processing Element modules, each having one or more Processing Elements and interfaces to multi-chip subsystems (MCSs). The Processing Elements bear the brunt of a SIMD computation's workload, while MCSs provide coordination among Processing Elements.

This disclosure of STAR-I teaches means that allow the tester digital system 10 to exploit the construction flexibility and programming scalability advantages of SIMD computer architecture. In a further aspect, STAR-I contains a circuit that allows the event-generation circuits to be flexibly allocated to DUT pins, thus reducing the cost of constructing a system capable of achieving required event rates when the event rate requirement varies across pins. In a further aspect, STAR-I applies Multi-Clock SIMD computer architecture to allow the multi-chip and intra-chip circuits within the tester digital system to operate each at its maximum rate as determined by the circuit topology and the signaling characteristics of the VLSI-based technology in which the circuits are realized. STAR-I maximizes the tester digital system's performance-to-hardware-cost ratio by applying what is taught in the I-Cached SIMD patent.

The architect of a tester faces the daunting challenge of creating a system using today's readily available component and assembly technologies that, in terms of logic signal transition rate and logic signal transition accuracy, outperforms devices that are planned to be made using tomorrow's exotic technologies. This difficult requirement has led naturally to the exploitation in tester architecture of the algorithmic parallelism inherent in the test computation. Surprisingly, the fields of tester design and parallel computer engineering have heretofore been distinct and mutually exclusive. This invention arises in part from a novel intersection of these two fields; part of what is claimed applies the optimizations and improvements known for parallel computer engineering to the practice of manufacturing tester digital systems.

The digital system 10 (otherwise known as the high-speed system) is the tester's primary algorithmic component. The digital system 10 comprises an array of timing generators 70 (TGs, sometimes referred to as event generators) that are collectively supervised by a single system controller 20. A group of timing generators 70 connects to each DUT pin's pin electronics (PE) 80 circuit via a pin channel 82. The PE circuit comprises a driver that produces input waveforms and a comparator that measures output waveforms against reference levels. The pin channel 82 fans in the TGs' drive control outputs to the PE's drive control inputs, and the pin channel 82 fans out the PE's comparator outputs to the TGs' measured pin value inputs. Individual events fall into the following four classes of precisely timed actions:

- a change of the state of the PE driver driving the pin input (driver on/driver off),
- a change of the value driven onto the pin by the PE driver (logic 1/logic 0),
- a change of the observation status of the pin output (begin comparing/stop comparing), or
- an instantaneous observation of the pin output value (compare logic 1/compare logic 0).

During a test run, the digital system system controller 20 executes a test program. The system controller 20 broadcasts a sequence of instructions to the array of TGs 70, which in response produce an event sequence for each DUT pin. A TG 70 is primarily a digital circuit that represents event types and application times as digital codes. In response to an instruction broadcast from the system controller 20, the TG 70 digitally calculates an event type, as well as the precise time of the application of that event to the DUT pin. These digital event codes are converted at the TGs' periphery to precisely timed driver control signal transitions (for input events) or to precisely timed pin value measurements (for strobe events). The conversion circuit is commonly called a formatter 74. The formatter 74 performs a digital-to-analog conversion of drive events and an analog-to-digital conversion of strobe events. The formatter's 74 time-domain digital-to-analog converter sub-circuit is called a vernier. The linearity, jitter, and re-trigger interval of the vernier contribute directly to a tester's most important performance characteristics.

Figure 1:
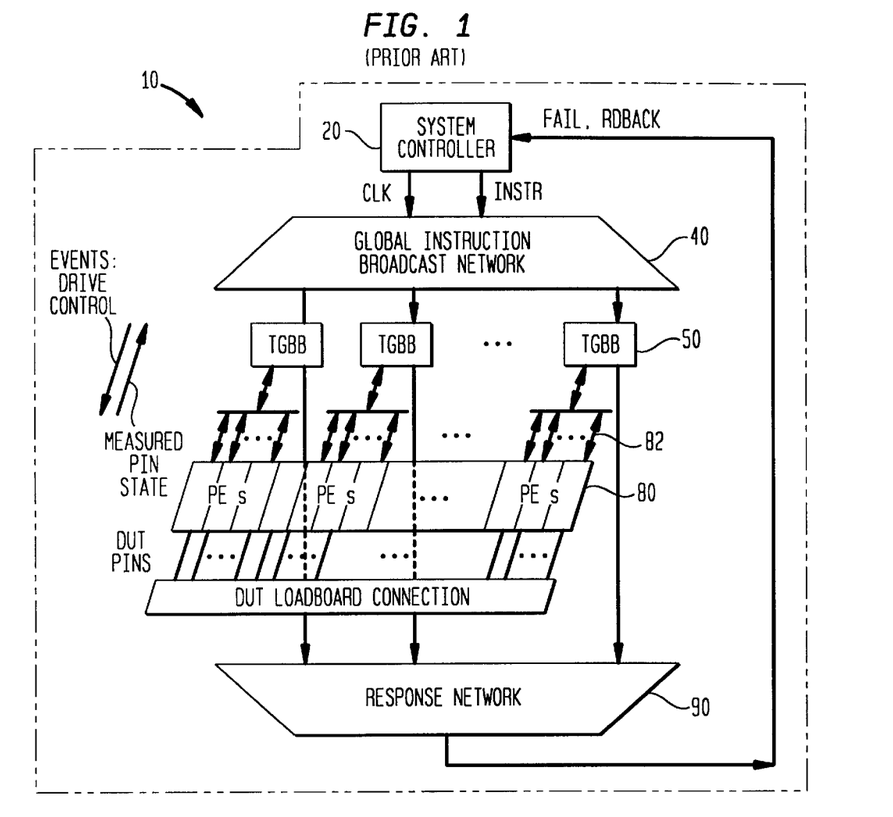
FIG. 1 is a schematic block diagram showing Conventional Tester Digital System Architecture of the prior art, described hereinabove.

A sketch of a conventional tester digital system 10 is shown in FIG. 1. The system controller runs a number of programs including the tester's operating system, test program development environment (compiler and debugger), results analysis tools, and DUT failure analysis tools. The primary function performed by the system controller 20 for the purposes of the digital system is storing and sequencing the test program.

Figure 2:
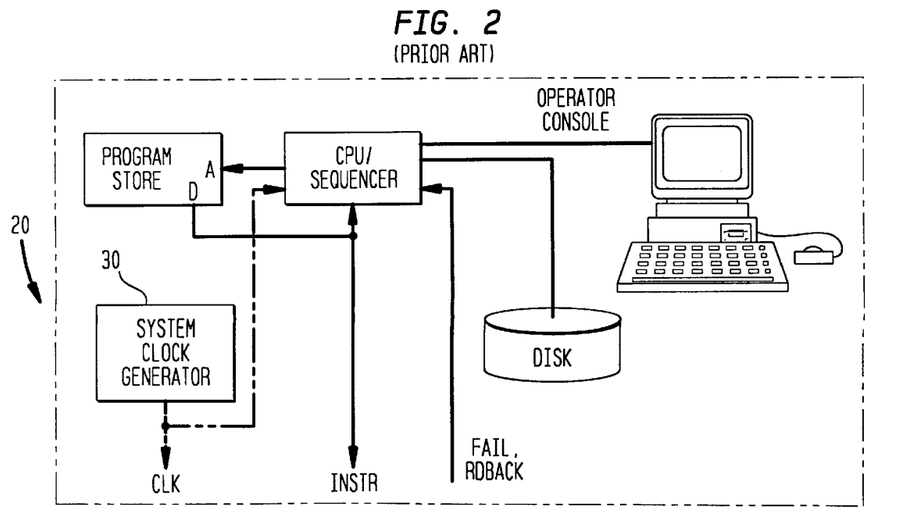
FIG. 2 is a schematic block diagram of a Conventional System Controller of the prior art, described hereinabove.

FIG. 2 shows some detail of the system controller 20. Via the operator console, the system controller 20 displays logged data to the operator, allows the operator to vary test parameters (pertaining to electrical, thermal, and timing characteristics of the DUT), and allows the operator to monitor and alter the test flow. The system controller's 20 disk storage device is the ultimate repository of test programs.

The system controller 20 generates a system clock 30 and, on each cycle of that clock 30, an instruction which is distributed through a global instruction broadcast network 40, shown in FIG. 1. The globally broadcast instruction specifies the logical DUT activity for a tester machine instruction cycle in addition to DUT clock phase information. The globally broadcast instruction specifies one of a known set of collections of per-pin event sequences, one event sequence per DUT pin.

The global instruction broadcast network 40 conveys the system clock 30 and instructions to an array of TGs 70. The TGs are realized within Timing Generator Building Blocks 50 (TGBBs). The TGBBs 50 occupy the preponderance of the circuits included in the digital system. The TGs respond to the system controller 20 with FAIL information indicating whether some DUT output pin strobe value differed from expectation on some vector. The TGs also provide RDBACK information allowing the system controller to monitor the state of each system element.

Figure 3:
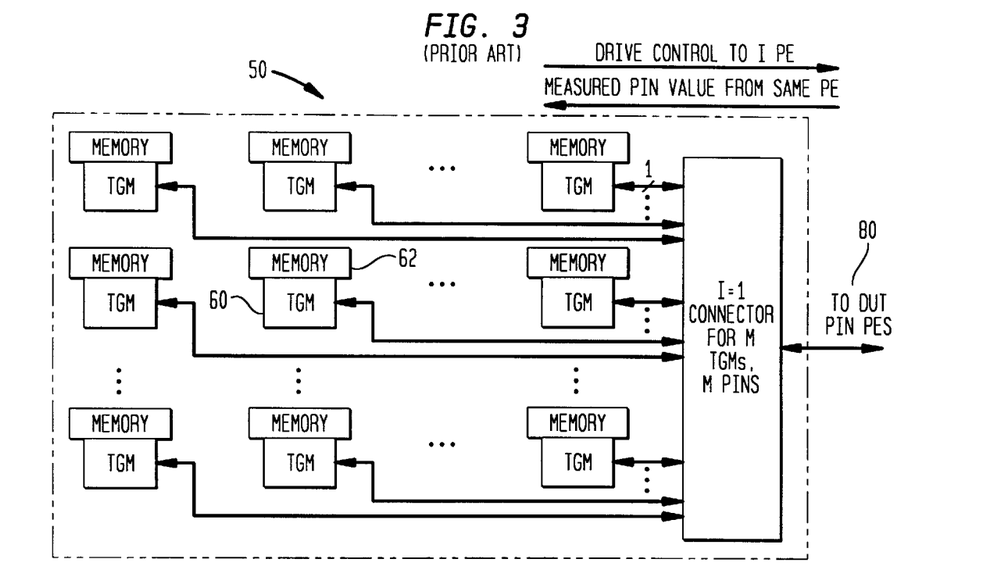
FIG. 3 is a schematic block diagram of a Conventional Timing Generator Building Block (TGBB) of the prior art, described hereinabove.

FIG. 3 sketches a conventional tester's TGBB 50. It contains an array of Timing Generator Modules 60 (TGMs), each of which in turn contains an array of TGs 70, associated with local memory 62 for storing TG configuration information including pattern data and local test result information including log data. As shown in FIG. 3, a conventional tester's TGMs 60 are associated on a 1-to-1 basis with DUT pin channels. A conventional tester immutably associates the collection of TGs 70 within a TGM 60 with a uniquely determined DUT pin channel 82.

Figure 4:
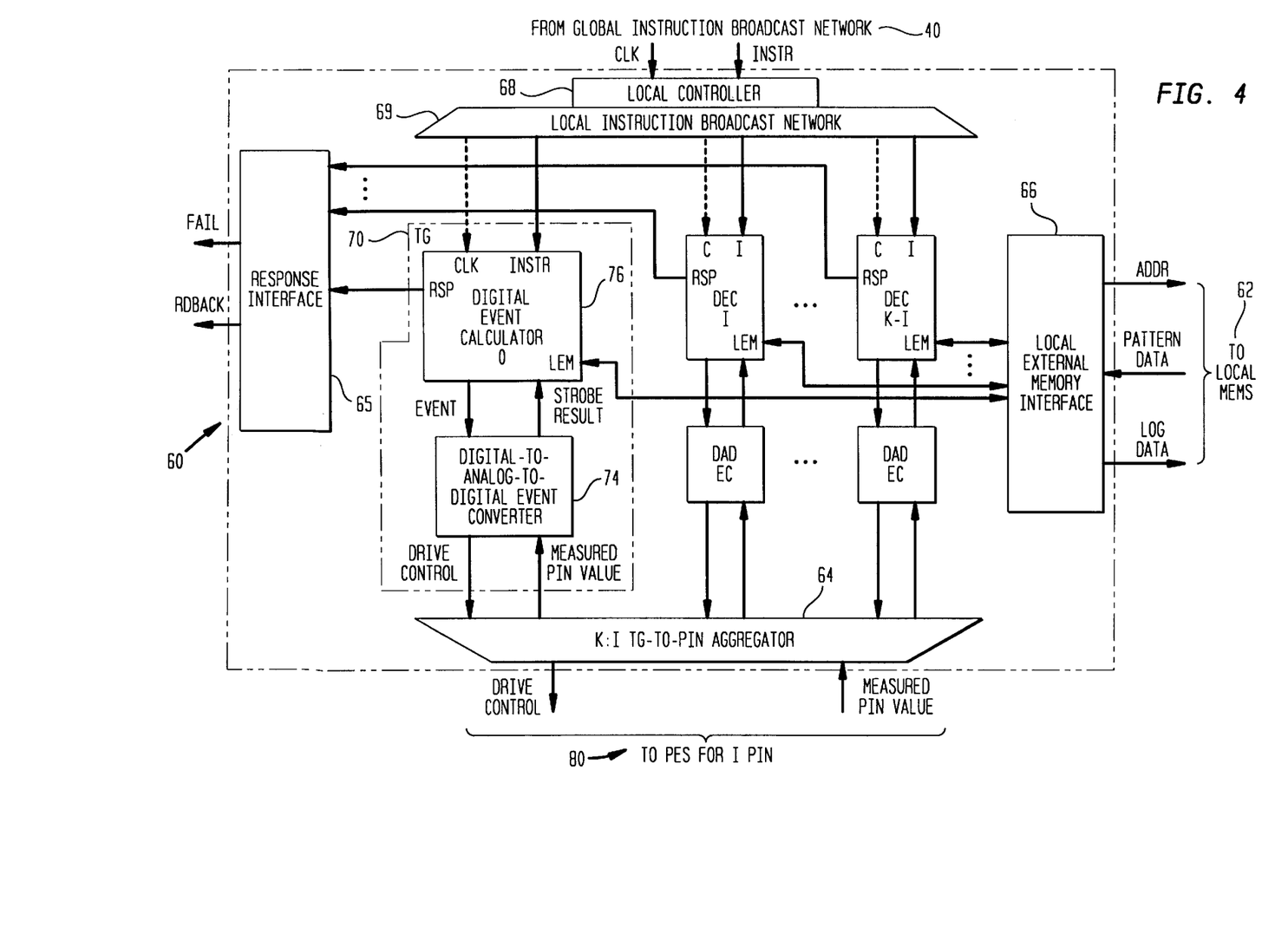
FIG. 4 is a schematic block diagram of a Conventional Timing Generator Module (TGM) of the prior art, described hereinabove.

FIG. 4 sketches a conventional tester's TGM 60 containing K TGs 70 and a K-to-1 TG-to-pin aggregator 64. The TG-to-pin aggregator 64 in a conventional tester combines drive events from the TGs 70 within the TGM 60 to send to the DUT pin channel 82, and it fans out the measured pin value to all TGs within the TGM for reference in strobe events. The TGM 60 also contains a response network interface 65 and a local external memory interface 66. The local controller 68 shown in FIG. 4 serves the modest function of electrically standardizing the clock received from the globally broadcast instruction for re-broadcast within the TGM. The local controller 68 also may provide pipeline stages for the globally broadcast instruction for subsequent re-distribution within the TGM via the local instruction broadcast network 69.

Figure 5:
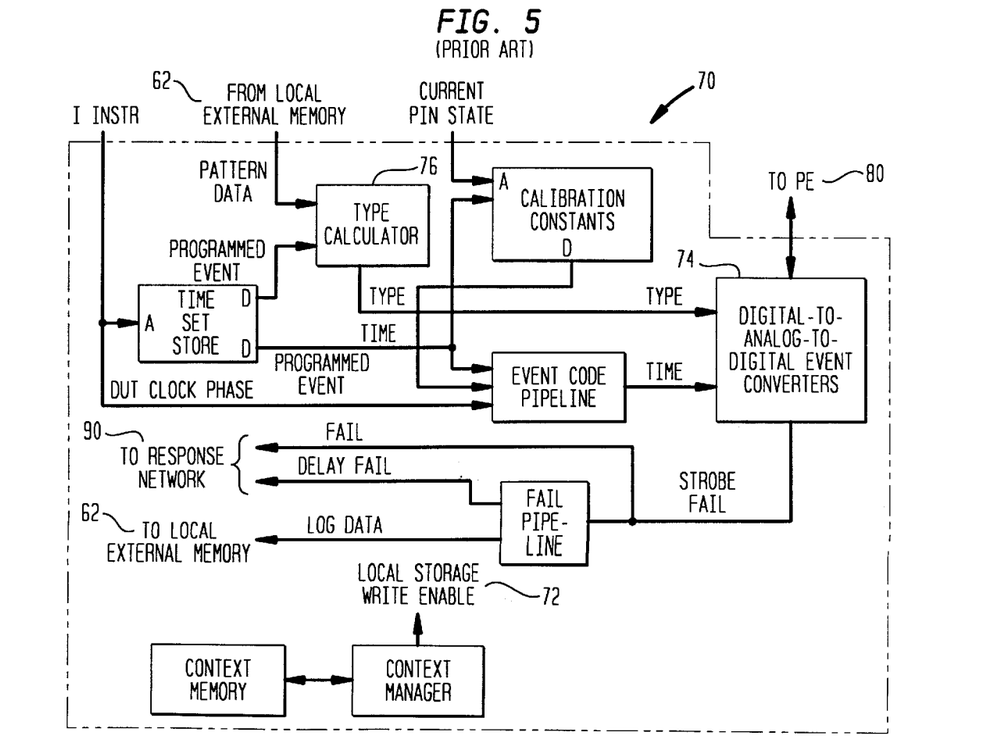
FIG. 5 is a schematic block diagram of a Conventional Timing Generator (TG) of the prior art, described hereinabove.

FIG. 5 shows a conventional TG 70. The TG 70 contains a number of storage elements that are read-only during functional test and are used to construct the event sequence. The digital-to-analog-to-digital event converter shown in FIG. 5 represents the TG's formatter circuit 74. The formatter 74 converts digitally coded drive events to PE driver control signal transitions that occur at the desired point in time, and it converts digitally coded strobe events to fail outputs that are achieved by sampling the logical value of the DUT pin (as represented by the PE comparator outputs) at the desired point in time. The conventional TG 70 also contains a fail pipeline through which log data is synchronized with the data logging requirements indicated in ensuing globally broadcast instructions.

When early testers were developed by semiconductor component makers in the 1960s, the common organization included a set of timing resources that were shared among all DUT pin channels in generating events. The system controller's 20 globally broadcast instruction included a collection of timing edges. A single TG 70 was associated with each DUT pin. Programming the tester required selecting, for each DUT pin, which of the timing resources applied to its events. As DUT timing complexity increased, the number of distinct timing resources required grew too large for this shared timing resource organization to remain practical for production of high-performance devices.

In 1982, IBM introduced the "timing-per-pin" organization, wherein the TG 70 associated with each DUT pin channel contained a timing generator circuit. This organization had the flexibility advantage of providing each DUT pin with potentially unique timing characteristics.

In the 1980s and into the 1990s, a number of tester manufacturers expanded on the timing-per-pin organization to include a collection of TGs 70 per pin. The TGs 70 in such systems are not necessarily replications of a single circuit design, but instead may be special-purpose circuits. The TGs 70 do not function independently, but produce events per tester machine instruction cycle as directed by a waveform memory associated with each DUT pin. This architecture is widely used in test equipment sold today.

In 1988, Schlumberger developed the "sequencer-per-pin" organization [West and Napier, "Sequencer Per Pin™ Test System. Architecture", *International Test Conference Proceedings*, pp. 355–361, 1990]. This digital system architecture provided for each DUT, pin channel 82 a fixed-size collection of timing generators 70 and a sequencer for assigning events to timing generators 70 for application to the DUT pin channel 82. This organization had the advantage of a high degree of flexibility in the timing characteristics of the waveform generated independently for each DUT pin.

The present invention is distinguished from these architectures in several aspects: In the present invention, the TG of is a generally programmable circuit that is replicated to provide the required per-pin event generator resource, the TGs 170 are interconnected so as to exchange intermediate data, the TGs 170 are flexibly allocated to DUT pins under software control, multi-clocking 300 allows the local generation of high-rate clocks within the TGMs 160, and SIMD instruction cache 310 eliminates the need for high-speed global instruction broadcast.

In 1989, ASIX proposed a digital system organization wherein the TGs 70 were inter-connected via a linear array network [Lesmeister, "The Linear Array Systolic Tester (LAST)", *International Test Conference Proceedings*, pp. 543–549, 1989]. This digital system organization allowed the TGs 70 to share access to a common pattern memory, thus decreasing the memory bandwidth requirement, thereby decreasing the cost of the test system.

The inter-TG communication subsystem 112 of the present invention 100 is distinguished from that of the ASIX architecture in two aspects: first, higher-dimensional interconnects (including 2-D and 3-D meshes), as well as bi-directional communication links are claimed; second, the present invention allows for exchange of TG register file data under control of the globally broadcast instruction stream 140, whereas the ASIX design provides only a fixed (hard-wired) flow of information from common pattern memory through the array of TGs.

In 1992, LTX/Trillium proposed a single-chip TG 70 design that contained an on-chip phase-lock loop (PLL)-based clock generator [Alton, "TGEN: Flexible Timing Generator Architecture", *International Test Conference Proceedings*, pp. 439–443, 1992]. The PLL output oscillated at 4 times the system clock rate but was not used to multiply the event rate above the system clock rate. Rather, the high-rate reference clock was used to simplify the implementation of a sub-clock-interval vernier (edge converter), whose linearity is critical to the testers overall timing accuracy. Linearity tends to decrease as the length of clock interval spanned increases, so the high-rate on-chip clock was used to shorten the interval spanned by the vernier.

Multi-clocking 300 as proposed in the present invention 100 is distinguished from the LTX invention in that in the present invention, the high-rate local clock 302 is used to regulate the digital portion of the TG 170. It is interesting to note that, with multi-clocking 300 as proposed in the present invention, it is yet possible and perhaps desirable to provide the verniers with a globally distributed clock. PLLs for local clock generation are known to exhibit clock jitter; with current technology, that jitter is on the order of 50 pS to 500 pS. While the digital portion of a TG is insensitive to jitter that is less than 10% of the interval of its regulating clock, the vernier circuit's timing accuracy is directly degraded by such jitter. Therefore, whereas 500 pS clock jitter would likely not disrupt a digital circuit operating at 200 MHz, as little as 50 pS jitter on the clock signal regulating the vernier would alone consume all of a modern high-performance tester's timing accuracy budget.

In 1992, Hewlett-Packard developed the "processor-per-pin" organization [Schoettmer and Minami, "Challenging the 'High Performance—High Cost' Paradigm in Test", *International Test Conference Proceedings*, pp. 870–879, 1995]. This digital system architecture provided for each DUT pin channel an independently programmed test processor for generating sequences of logical values and controlling the generation of successive events for application to the DUT pin channel. This organization had the advantage of reducing the amount of information delivered through the global instruction broadcast network, thus reducing its cost.

By moving sequencing from the system controller 20 into the TG 70, the HP invention surmounts the global instruction broadcast bottleneck, which limits the flexibility and scalability of a test system and therefore tends to increase its cost. The HP digital system architecture is a MIMD computer. The present invention has a number of advantages over the HP architecture: the present invention is a SIMD computer and therefore enjoys an inherently lower implementation cost: A SIMD processing element is known to cost as little as 20% as much as its MIMD counterpart. The HP architecture does not provide for global control of the TGs 170 during a test run, whereas an I-Cached SIMD tester digital system 110 provides control over the TGs 170 at a moderate granularity via the global instruction broadcast network 140. The per-pin processors in the HP architecture do not exchange intermediate data, whereas the TGs of the present invention have that capability. Finally, as do the conventional test systems, the HP architecture allocates a fixed processing resource to each pin of the DUT; the present invention, by contrast, allocates a number of TGs to each DUT pin as dictated by the requirements of the test program.

The state of the art of tester digital system architecture has progressed over the last 30 years, through a series of independent innovations, from "shared timing", to "timing-per-pin", to "sequencer-per-pin", to "processor-per-pin". In this light, the present invention may be seen to constitute a "re-configurable array of processing elements per pin" architecture. The various innovations claimed, applied independently or together, provide the flexibility needed to engineer a high-performance tester whose digital system costs less and is smaller than those of conventional testers.

SUMMARY OF THE INVENTION

Here follows a list of enhancements that are part of STAR-I, with a brief description of what is gained by each:

In one aspect, STAR-I contains a TG 170 whose architecture is that of a generally programmable processing element. This enhancement over the conventional tester's somewhat-configurable TG 70 increases flexibility and scalability, for example allowing the TG design cost to be amortized over a larger number of instances sold.

Figure 6:
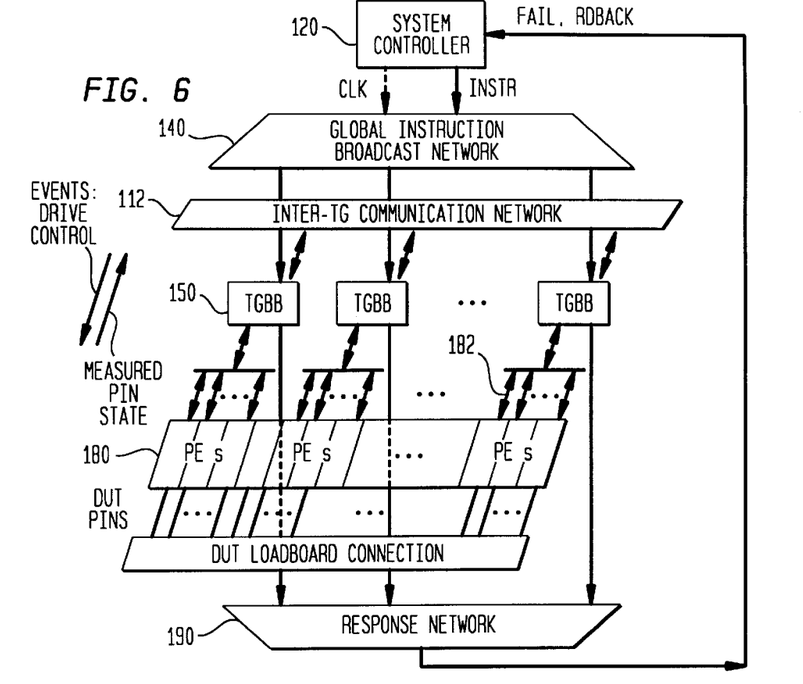
FIG. 6: STAR-I Digital System Architecture.
Figure 7:
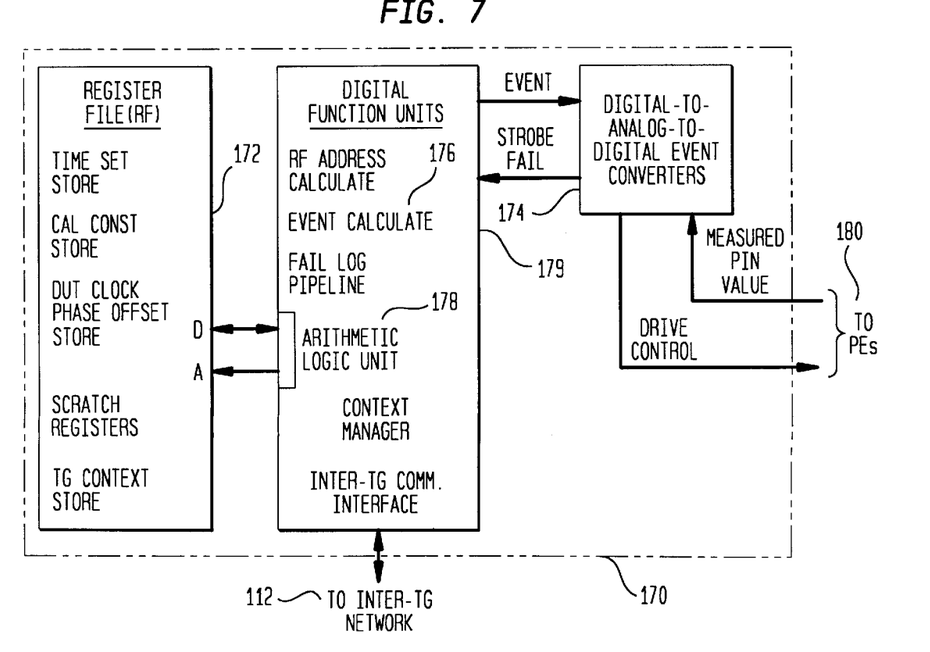
FIG. 7: Generally Programmable TG.

In an independent aspect, STAR-I includes an inter-TG communication subsystem 112. A subsystem whose topology is a major discriminating characteristic among the parallel computers used for more general-purpose applications, an inter-TG communication subsystem 112 is absent from conventional testers because production test as it is commonly realized requires no inter-TG communication. The advantage of including an inter-TG communication network 112 is that it enables the TGs 170 to share intermediate results, such as are generated during the execution of APG or DSP algorithms. An inter-TG communication network 112 is sketched in FIG. 6, FIG. 8, and FIG. 10.

In a further aspect, the STAR-I digital system includes a software-configurable reconfigurable allocator circuit 152, through which a subset of the set of TGs is associated with one member of a subset of the set of DUT pin channels. The association achieved by the reconfigurable allocator circuit 152 is to multiplex the drive events produced by each member of the subset of TGs onto the corresponding drive control input of the pin channel and also to fan out that pin's observed logical value for use by strobe events within each member of the subset of TGs. The appropriate size and hierarchical decomposition of the reconfigurable allocator circuit 152 is determined by the geometries of the elements composing the integration hierarchy used in the physical realization of the tester digital system. The most general reconfigurable allocator circuit 152 is an N×M cross-bar through which any of the tester's N TGs 170 is associated with any of the DUT's M pins.

A further aspect of STAR-I is the method for configuring the reconfigurable allocator circuit 152. A simplest way of deciding how to configure a reconfigurable allocator circuit 152 restricts the subsets of TGs connected to each DUT pin to be totally disjoint subsets of the set of TGs 170. In other words, a simplest method of configuring a reconfigurable allocator circuit 152 imposes a many-to-one mapping from TGs to DUT pins. At the maximally complex other end of the spectrum, STAR-I includes a reconfigurable allocator circuit 152 implementing a many-to-many mapping, so that each TG 170 in the tester digital system 110 is associated with some number of DUT pins and each DUT pin is associated with a plurality of TGs 170. This more complex TG-to-DUT-pin allocation method is able to take advantage of scenarios wherein a single TG's outputs may be shared among a plurality of DUT pins. The simpler method allows for a circuit interconnect topology that requires relatively few active elements for its realization.

Figure 9:
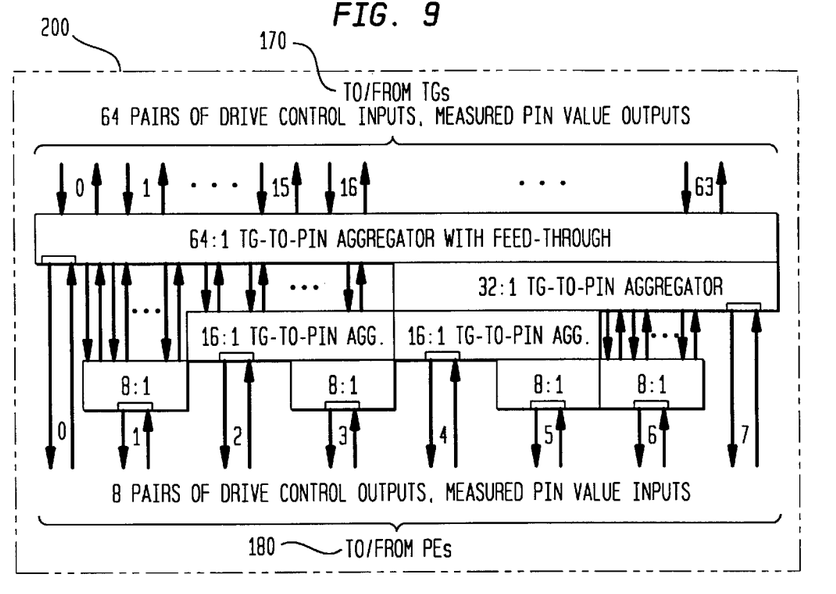
FIG. 9: Topology of Preferred Embodiment of 64-to-8 Reconfigurable Allocator Circuit.

FIG. 9 shows an example of a reconfigurable allocator circuit 152 implementation that is appropriate for the simple (many-to-one) allocation method and which is less costly than a full cross-bar. In the example sketched in FIG. 9, the reconfigurable allocator circuit 152 is capable of realizing many-to-one associations between 64 TGs 170 and 8 pin channels.

A general mathematical formulation for the topology of this class of reconfigurable allocator circuit 152 interconnection for a set of I TGs 170 numbered from 0 up to I-1 and a set of J pin channels numbered from 0 up to J-1 may be described with the following two principles:

1) the number of TGs 170 in the subset that may be associated with the pin channel 182 whose index is j is given as $I/(\text{ceiling}(\log_2(j+1)))$.
2) the subset of TGs 170 associated with pin channel j is disjoint from the subsets of TGs 170 associated with each of the $2^{\text{ceiling}(\log_2(j+1))-1}$ pin channels 182 whose indices lie in the following range:

$$2^{\text{ceiling}(\log_2(j+1)-1)}+1, 2^{\text{ceiling}(\log_2(j+1)-1)}+2, \ldots, 2^{\text{ceiling}(\log_2(j+1))}.$$

FIG. 9 sketches an example for I=64 and J=8. In the example, the pin channel 182 numbers have been permuted for drawing clarity.

A further enhancement of the reconfigurable allocator circuit 152 is to allow re-configuration during functional test. This enhancement allows a given TG 170 to be connected successively to members of a group of DUT pins. This "run-time TG 170 reallocation" capability caters for the applications such as edge search, wherein a single member of a group of pins receives a relatively large number of events during some interval of the test. By re-configuration of the reconfigurable allocator circuit 152, a relatively small number of timing generators 170 is able to meet the edge rate requirement that, in a fixed allocation of timing generators 170 to DUT pins, would require many more timing generators 170 and thus greater expense.

A further enhancement is to include some subset of the digital system's reconfigurable allocator circuit in the TGBB 150.

In a further aspect, STAR-I incorporates a compilation method for analyzing the event rate requirements of test programs. By determining at the time the test program is created how many TGs 170 need to be associated with each pin to achieve the required event rate for that pin, STAR-I minimizes the total number of TGs 170 included in the tester provided to a customer for specific test purposes, thereby minimizing the cost of the tester. This method restricts the topology by which the collection of DUT pin PEs is associated with tester TGBBs 150, because it would be most cost-effective to evenly distribute the high-event-rate pins across the set of TGBBs 150.

A further aspect of STAR-I is to include a local controller 168 in the TGM 160 that is capable of decoding globally broadcast instructions into a single-clock-cycle control word for the TGs 170 realized within the TGM 160.

Another aspect of STAR-I includes a Local External Memory interface 166 in the TGM 160.

Another aspect of STAR-I includes a generalized response network interface 167 in the TGM.

A further aspect of STAR-I augments the TGM 160 to contain a Multi-Clock Generator 300 as taught in my I-Cached SIMD patent.

A further aspect of STAR-I includes an I-Cache 310 in one of its many forms as taught in my I-Cached SIMD patent.

If a tester digital system is a SIMD computer, then it is subject to the global instruction broadcast bottleneck which I have shown elsewhere to be a fundamental limitation of conventional SIMD computer architectures. Therefore, the techniques of Multi-Clocking and I-Caching that overcome the global instruction broadcast limitation for SIMD computers in general also overcome the global instruction broadcast limitation for tester digital systems in particular. It has been established that I-Cached SIMD technology increases the performance-to-cost ratio of SIMD computers by factors of 2 to 5 or more. It is reasonable to expect a proportionate decrease in tester cost at constant performance by applying the enhancements described in the I-Cached SIMD patent to the tester digital system.

BRIEF DESCRIPTION OF THE DRAWINGS

A better understanding of the present invention may be realized from a consideration of the following detailed description, taken in conjunction with the accompanying drawings, in which:

FIGS. 6–13 are schematic block diagrams illustrating various portions of the preferred embodiments of the present invention, designated as follows:

FIG. 10.5: Local Controller for STAR-I TGM with Multi-Clock Generator and SIMD Instruction Cache;

DESCRIPTION OF THE PREFERRED EMBODIMENTS

Anticipated Tester Manufacturing Cost Savings Arising From STAR-I

System Controller (cf. FIG. 1)

A conventional tester's system controller is expensive, comprising typically an engineering workstation, an internal Ethernet, a RISC processor board, a custom CPU bus interface (for example, VME), and a custom high-speed sequencer, which is typically a multi-custom-PCB circuit containing several ASICs. In stark contrast to this expensive implementation, the system controller as embodied in the invention need consist only of an inexpensive standard microcomputer (for example, an x86-based PC) equipped with disk drive, high-quality display, and a standard system bus interface (for example, PCI).

Global Instruction Broadcast Network (cf. FIG. 1)

A conventional tester's global instruction broadcast network consists of a workstation bus (for example, VME), a custom CPU bus controller, a signal fan-out network conveying on the order of 100 bits of instruction to the TGBBs at very high speed (for example, 500 MHz), a digital system clock generator, and trimmed and balanced transmission lines for distribution of the collection of high-speed signals. In stark contrast to this expensive implementation, the global instruction broadcast network as embodied in the invention consists only of a standard microcomputer system bus, with fewer than 100 signals bussed at low signaling rate to the array of TGBBs.

Response Network (cf. FIG. 1)

The tester's response network contains a FAIL tree, for rapid detection by the system controller of a failure having been detected by any TG for any DUT pin, and a slower, wider path for reading the contents of any storage location. In addition to a conventional FAIL tree, the response network embodied in this invention contains a standard microcomputer bus which is less expensive than the semi-custom engineering workstation bus incorporated in conventional testers.

Figure 8:
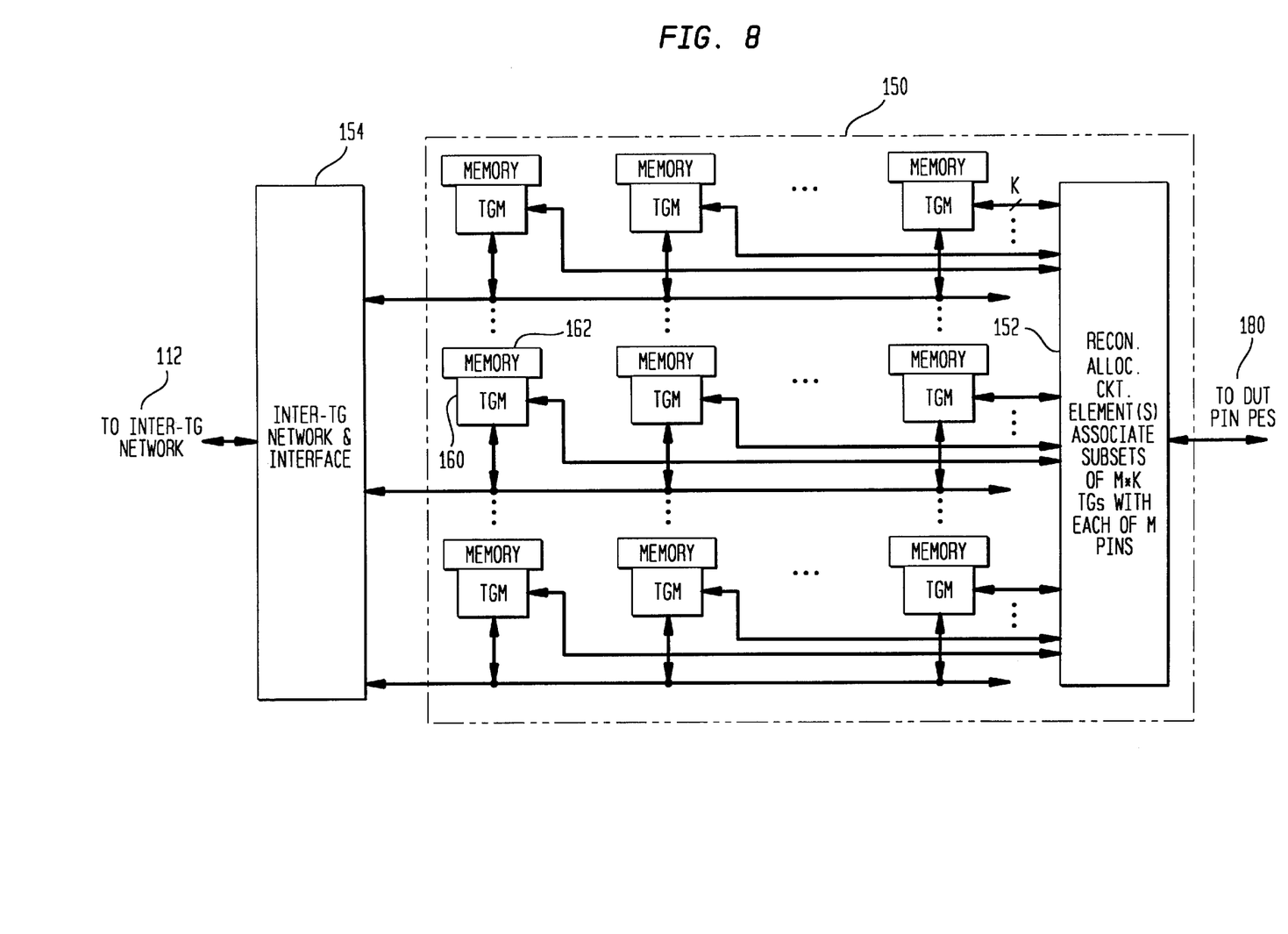
FIG. 8: TGBB with Reconfigurable Allocator Circuit Element(s)

TGBB (cf. FIG. 3 and FIG. 8)

The TGBB contains an array of TGMs. FIG. 3 shows a conventional TGBB, while FIG. 8 shows a STAR-I TGBB. As shown in FIG. 3, the TGBB of a conventional tester implements a 1-to-1 connection between TGMs and DUT pin channels. As indicated in FIG. 8, the STAR-I TGBB as embodied in some aspects connects the individual TGs within the set of TGMs via at least one programmable reconfigurable allocator circuit element to the DUT pin channels.

Figure 10A:
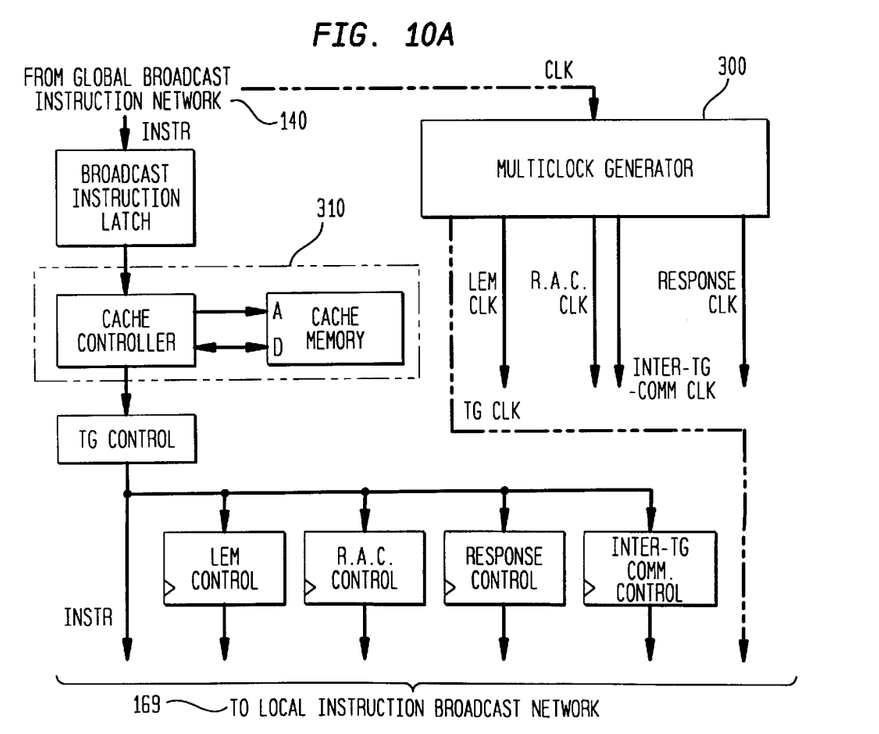
FIG. 10: STAR-I TGM.
Figure 10B:
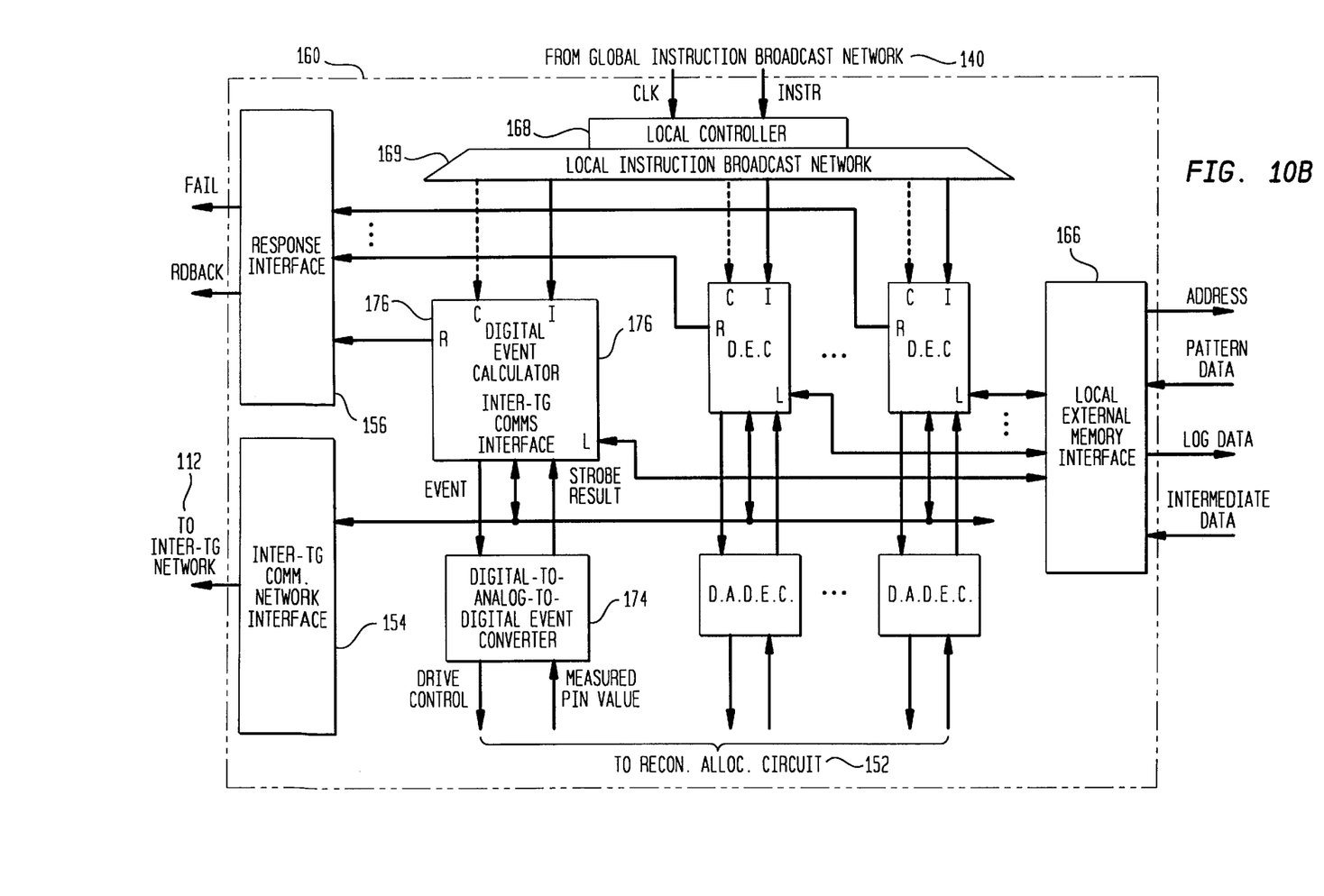
Figure 11:
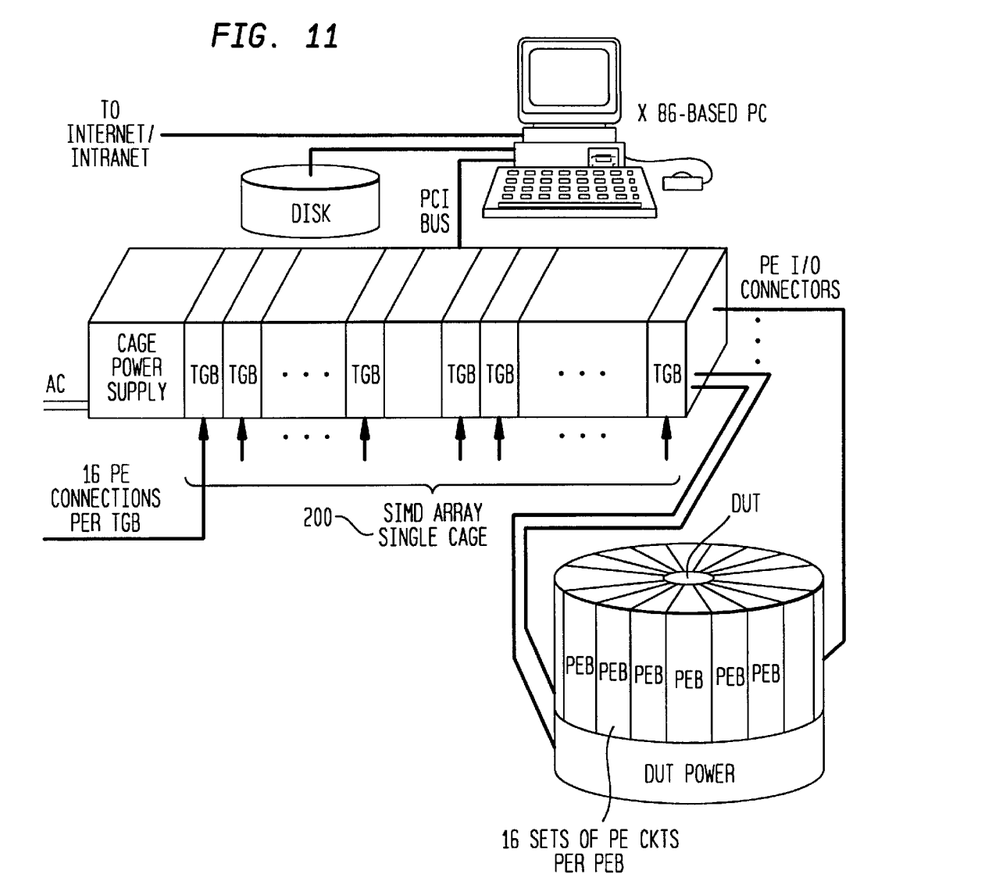
FIG. 11: A readily realizable embodiment of a STAR-I Tester.

TGM (cf. FIG. 4, FIG. 10, and FIG. 10.5)

A TGM contains a local controller which, in conventional testers, electrically standardizes the incoming system clock and stages globally broadcast instructions for local re-broadcast to the TGs within the TGM. FIG. 4 shows a conventional TGM, FIG. 10 shows a STAR-I TGM, and FIG. 10.5 shows detail of the local controller of a STAR-I TGM that is enhanced with a multi-clock generator and SIMD instruction cache. The Multi-Clock Generator (as defined in my I-Cached SIMD patent) shown in FIG. 10.5 generates an individual clock for every circuit contained within or connected to the TGM. The clocks generated by the Multi-Clock Generator regulate every such circuit each at its maximum rate. The local controller shown in FIG. 10.5 further contains a SIMD instruction cache (as defined in the I-Cached SIMD patent) that stores sequences of instructions that are executed repeatedly. I-Caching in a STAR-I tester digital system allows sequences of vector types that are repeated during functional test to be delivered to the TGs at the TG's highest rate of operation.

Reconfigurable Allocator Circuit (cf. FIG. 4, FIG. 8, and FIG. 9)

Tester digital systems achieve high event rates by ganging together collections of TGs onto each DUT pin. FIG. 4 shows a conventional TGM. FIG. 8 shows a TGBB containing reconfigurable allocator circuit element(s). As an example, FIG. 9 shows how a 64-to-8 reconfigurable allocator circuit might be realized using a collection of TG-to-pin aggregators of various sizes. As suggested by the presence of a K-to-1 TG-to-pin aggregator in FIG. 4, conventional tester digital systems allocate a fixed number of TGs to each pin by performing aggregation within the TGM. In the conventional tester, a common number of TGs is associated with each DUT pin, unless expensive measures, fixed at the time of system manufacture, are taken so as to bring to bear on a high-event-rate pin the TG resources that would otherwise have served multiple pins. Unfortunately, it can readily be shown that not all DUT pins require a common event rate. The event rate required for a pin is determined by the design objectives of the DUT and by the objectives of a given test. At any given point during the testing of a DUT, some pins need higher event rates while other pins need lower event rates. In a conventional tester, when a pin requires a higher event rate (and thus more TGs), considerable hardware expense is incurred. Should a pin actually require a lower event rate, then the excess TGs allocated to the pin represent hardware expense that is wasted. The advantages of connecting TGs to pins via a reconfigurable allocator circuit includes reducing the hardware cost required to achieve the required per-pin event rate.

System (cf. FIG. 9)

FIG. 9 illustrates the concept of an inexpensive high-performance tester. The tester sketched in FIG. 9 is manufacturable with today's technologies at a significantly lower cost than that of a similar-performance conventional tester.

Figure 12:
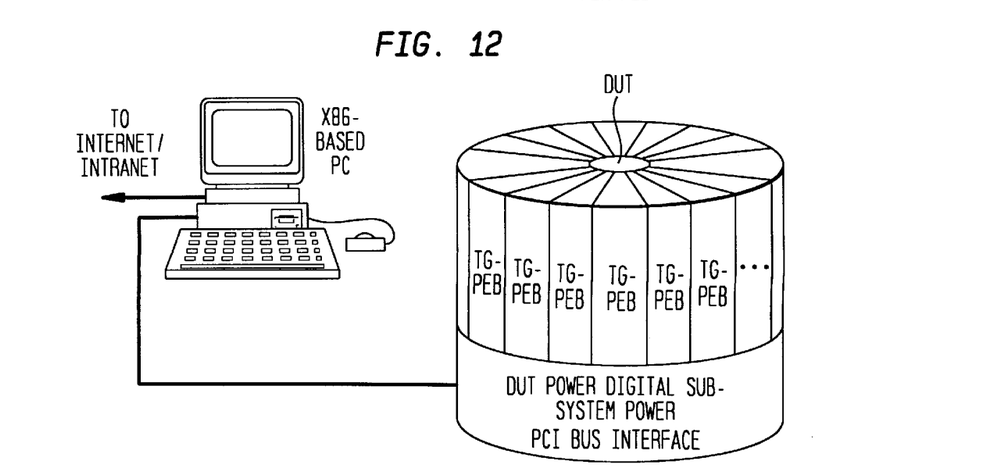
FIG. 12: A highly integrated embodiment of a STAR-I Tester.
Figure 13:
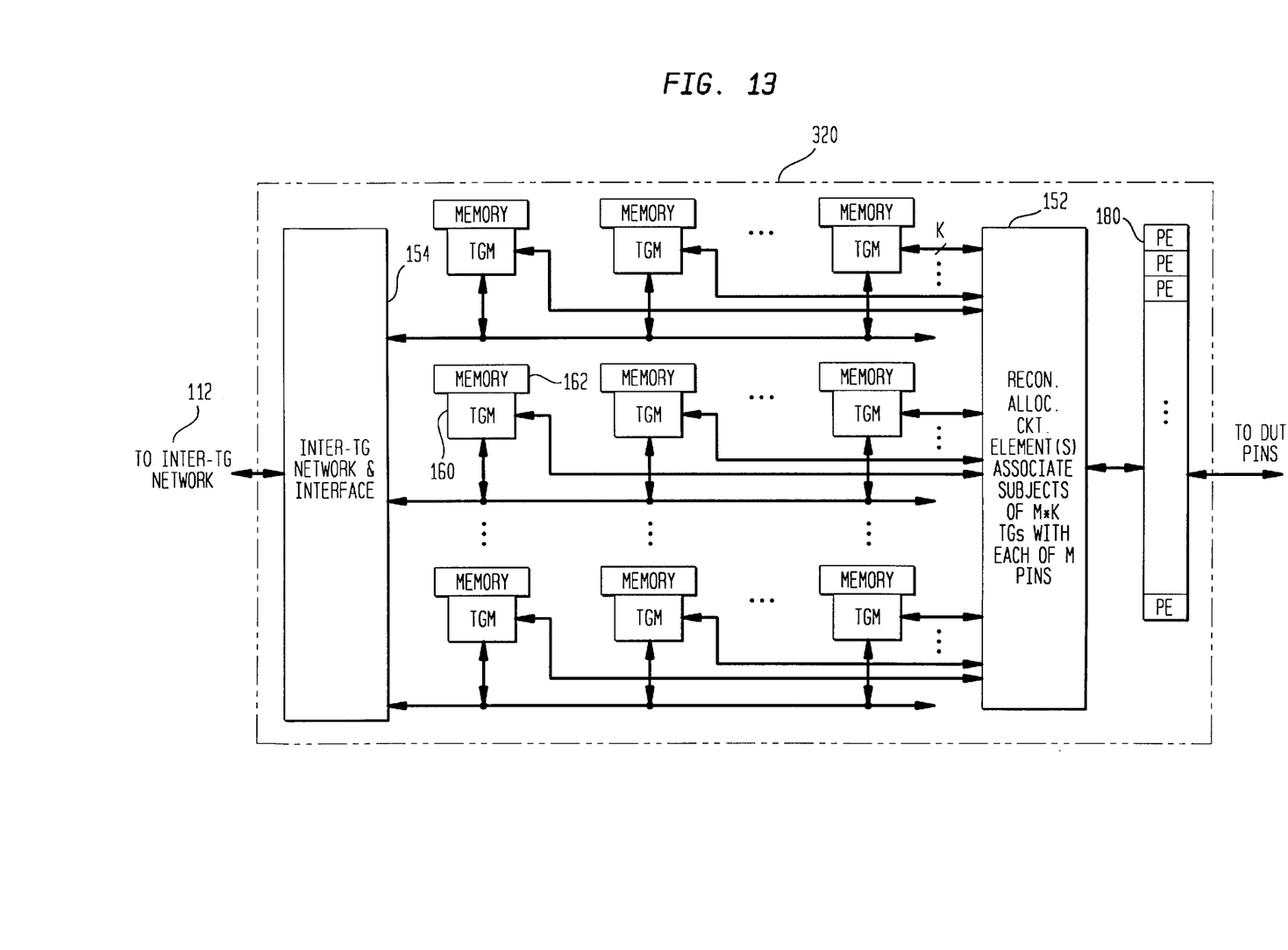
FIG. 13: Timing Generator/Pin Electronics Board (TGPEB).

TGPEB (Timing Generator/Pin Electronics Board, cf. FIG. 9, FIG. 13, and FIG. 12)

Future increases in BiCMOS ASIC integration densities will make it possible to migrate the SIMD array cage (containing the TGs) shown in FIG. 9 into the test head (containing the PEs) while migrating the PEs into the reconfigurable allocator circuits. The integrated TGPEB is shown in FIG. 13. The resulting tester, sketched in FIG. 12, would allow further manufacturing cost reduction.

Extrapolating conservatively from the empirical results (presented in my prior publications and disclosures) regarding the performance-to-cost ratio increase afforded by I-Cache Enhancement, I expect the various aspects of this invention, combined in a variety of parametric instantiations, to decrease by at least one-third, and at most three-quarters, the materials, assembly, and installation cost of a tester made using current and foreseeable VLSI and system implementation techniques and meeting a given event rate and timing accuracy performance requirement.

Although there have been described hereinabove various specific arrangements of a STAR-I: SCALABLE TESTER ARCHITECTURE WITH I-CACHED SIMD TECHNOLOGY in accordance with the invention for the purpose of illustrating the manner in which the invention may be used to advantage, it will be appreciated that the invention is not limited thereto. Accordingly, any and all modifications, variations or equivalent arrangements which may occur to those skilled in the art should be considered to be within the scope of the invention as defined in the annexed claims.

What is claimed is:

1. A Single Instruction-stream, Multiple Data-stream (SIMD) semiconductor chip tester apparatus for testing a Device Under Test (DUT) which has a plurality of electrical contact input and output pins to serve as input and output signal paths for coupling to tester circuitry, said semiconductor tester comprising:

a plurality of pin electronics circuits corresponding to said plurality of pins of a DUT for operative connection thereto in one-to-one relationship;

a plurality of pin channels individually coupled to corresponding pin electronics circuits for communication with corresponding DUT pins;

a digital system controller generating a system clock and storing and sequencing a test program;

a plurality of timing generator modules responsive to said digital system controller, each module being a single semiconductor chip having an array of timing generators formed thereon for creating predetermined sequences of precisely timed drive events and strobe events in accordance with the test program and system clock, for testing the DUT, said timing generators having programmable processing capabilities and being selectively associatable under software control with selected ones of said pin channels so that a plurality of timing generators can be selectively associated with each selected pin channel in a many-to-one relationship; and a plurality of multi-chip subsystems controlling, coordinating, and memory-augmenting the timing generator modules, each timing generator module further comprising interface connections between said multi-chip subsystems and each of the timing generators in said module.

2. The tester apparatus of claim 1 further comprising a digital system including:

a global instruction broadcast subsystem distributing clock information and instructions from the system controller to said timing generator modules;

a response subsystem collecting and returning test status information from said timing generator modules to said system controller; and a DUT input/output subsystem incorporating an interface realized within the timing generator module, said interface providing connections between said timing generators and said pin channels.

3. The tester apparatus of claim 1 wherein each timing generator includes at least one event calculator circuit and at least one mark generator circuit, wherein said event calculator circuit is realized using digital circuit design technique and said mark generator circuit comprises a dynamically reconfigurable programmable delay circuit which is realized using analog circuit design technique.

4. The tester apparatus of claim 3 wherein each of said timing generator event calculator circuits is a programmable processing element for increased flexibility and scalability of the timing generator.

5. The tester apparatus of claim 4 wherein said programmable processing element is capable of general-purpose calculations.

6. The tester apparatus of claim 5 wherein said programmable processing element includes:

an arithmetic logic unit;

a register file having a read port and a write port;

a plurality of function-unit-equivalent interfaces to said multi-chip subsystems; and a context management unit, said processing element being capable of conditionally executing register-to-register operations and exchanges of register file data via said multi-chip subsystems.

7. The tester apparatus of claim 2 further comprising a communication subsystem interconnecting said timing generator modules to enable various pairs of timing generators within said digital system to exchange intermediate test results and other data.

8. The tester apparatus of claim 1 wherein the digital system controller includes compiler means for analyzing the event rate requirements of test programs sought to be applied and for calculating the number of said timing generators necessary to associate with each of said pin channels in order to achieve the required event rate for that pin channel and to determine the total number of said timing generators required for an applied test program.

9. The tester apparatus of claim 1 wherein said timing generator module comprises a local controller capable of decoding globally broadcast instructions into an instruction for re-broadcast within said timing generator module to each of said multi-chip subsystem interfaces and to each timing generator in said array.

10. The tester apparatus of claim 2, further comprising:
a plurality of local external memory subsystems providing the timing generators with memory capacity exceeding that which is realizable within a single-chip timing generator module,
wherein each local external memory subsystem includes a plurality of memory modules having at least one memory chip, each of said local external memory subsystems being associated with a unique one of said timing generator modules in a one-to-one association.

11. The tester apparatus of claim 2 wherein said digital system comprises a reconfigurable timing generator-to-pin channel allocator circuit, wherein
a plurality of software-specified subsets of said timing generators is associated with said pin channels, and
each of said software-specified subsets is in one-to-one association with a unique one of said pin channels in order to multiplex the events produced by each timing generator of each of said software-specified subsets onto said unique one of said pin channels and to distribute the observed pin value output of each of said pin channels to each member of each associated software-specified subset of timing generators.

12. The tester apparatus of claim 11 wherein said software-specified subsets of said timing generators are mutually disjoint.

13. The tester apparatus of claim 11 wherein said reconfigurable allocator circuit is adapted for run-time reallocation by allowing reconfiguration of said reconfigurable allocator circuit during the conducting of a functional test, wherein said reconfiguration is achieved in response to globally broadcast instructions.

14. The tester apparatus of claim 13 wherein said reconfigurable allocator circuit comprises a cross-bar switch capable of providing connecting paths between each of said timing generators and every one of said pin channels.

15. The tester apparatus of claim 11 wherein said reconfigurable allocator circuit comprises a first configuration providing a many-to-one mapping from each of said timing generators to each of said pin channels.

16. The tester apparatus of claim 15 wherein said reconfigurable allocator circuit further comprises a second configuration providing a many-to-many mapping, whereby each of said timing generators is associated with at least one of said pin channels and each of said pin channels is associated with a plurality of said timing generators.

17. The tester apparatus of claim 11 wherein said reconfigurable allocator circuit comprises a circuit topology providing selected proper subsets of the set of possible connections between said timing generators and said pin channels.

18. The tester apparatus of claim 11 wherein said reconfigurable allocator circuit comprises a cross-bar switch in one-to-one association with each of said timing generator modules, said cross-bars providing a plurality of pathways between every timing generator within said array and every one of said pin channels associated with said timing generator module.

19. The tester apparatus of claim 11 wherein said reconfigurable allocator circuit further comprises:
a selectively enabled electrical path between each of said timing generators and a plurality of said pin channels;
a memory-based configuration control circuit enabling exactly one of the available paths from each of said timing generators;
at least one time-domain edge multiplexor combining control signals from the timing generators associated with each of said pin channels as determined by the contents of said control memory; and
at least one analog de-multiplexor distributing the measured pin value to the timing generators associated with each of said pin channels as determined by the contents of said control memory.

20. A timing generator module for use in a Single Instruction stream, Multiple Data-stream (SIMD) semiconductor tester, said timing generator module comprising:
an array of generally programmable timing generators;
at least one multi-clock generator having a multi-clock generator circuit responsive to applied tester system clock signals for generating a plurality of high-rate clock signals;
means for receiving program instructions for controlling said timing generators; and
a cache element for storing said program instructions and a cache controller associated therewith, wherein said cache controller is responsive to globally broadcast instructions for the purposes of storing selected instructions in said cache element and for retrieving designated instruction sequences from said cache element for local re-broadcast within the timing generator module,
wherein the generated plurality of high-rate clock signals regulates subsystems within and connected to the timing generator module, each at its maximum rate of operation as determined by its physical implementation.

21. A multi-clock Single Instruction stream, Multiple Data-stream SIMD semiconductor tester digital system comprising:
a global instruction broadcast network regulated by a system clock signal oscillating at a system clock rate;
a multi-chip subsystem regulated by a second clock signal; and
a timing generator module coupled to said global instruction broadcast subsystem and to said multi-chip subsystem, said timing generator module being implemented on a single chip and including
a first internal subsystem regulated by a third clock signal,
a second internal subsystem regulated by a fourth clock signal,
a multi-clock generating circuit, responsive to said system clock signal, generating a plurality of clock signals including said second, third, and fourth clock signals, wherein
one of said third and fourth clock signals is a timing generator module clock signal oscillating at a timing generator module clock rate which is higher than said system clock rate, and
said second clock signal oscillates at a multi-chip subsystem clock rate which is higher than said system clock rate but no higher than said timing generator module clock rate,
means for receiving program instructions for controlling said timing generator module, and
a cache element for storing said program instructions and a cache controller associated therewith, wherein said cache controller is responsive to globally broadcast instructions for the purposes of storing selected instructions in said cache element and for retrieving designated instruction sequences from said cache element for local re-broadcast within said timing generator module.

22. A tester for testing a device under test (DUT) having a plurality of contact points for accessing circuitry inside the DUT, the tester comprising:

a plurality of timing generator building blocks producing event sequences for the plurality of contact points of the DUT, wherein each timing generator building block includes a plurality of timing generator modules, and each timing generator module includes a plurality of timing generators, and wherein each timing generator is associated with a respective contact point of the DUT; and a communication network allowing exchange of data among the plurality of timing generator building blocks so that each timing generator building block can exchange data with each of the other timing generator building blocks, for producing the event sequences.

23. A tester as in claim 22, wherein said data includes data related to, and not related to, a current state of a contact point under test.

24. A tester as in claim 22, wherein said data includes data related to, and not related to, a current state of a contact point under test.

25. A tester as in claim 22, further comprising:

a system controller providing a system clock signal and instructions based on a test program; and a global instruction broadcast network broadcasting the system clock signal and instructions to the plurality of timing generator building blocks, so that the event sequences are produced in accordance with the test program.

26. A tester as in claim 22, further comprising:

a system controller providing a system clock signal and instructions based on a test program; and a global instruction broadcast network broadcasting the system clock signal and instructions to the plurality of timing generator modules, so that the event sequences are produced in accordance with the test program.

27. A tester as in claim 22, further comprising:

a reconfigurable allocator unit selectively associating respective timing generators to respective contact points, so that associations between timing generators and contact points are reassignable under software control.

28. A tester as in claim 21, wherein the timing generators are divided into a plurality of subsets of timing generators, each subset including at least one timing generator, the contact points are divided into a plurality of subsets of contact points, each subset including at least one contact point, each subset of timing generators is associated with a subset of contact points, and the tester further comprises a reconfigurable allocator unit which, for each subset of timing generators, selectively associates each timing generator of the subset of timing generators to a respective contact point of the associated subset of timing points, so that associations between timing generators and contact points are reassignable under software control.

29. A tester as in claim 21, wherein each timing generator module has at least one subsystem which is within, or connected to, the timing generator module, and each timing generator module includes a multi-clock generator receiving a system clock signal and generating a plurality of local clock signals from the system clock signal, the plurality of local clock signals including a local clock signal for regulating each subsystem of said at least one subsystem of the timing generator module at substantially the highest rate of operation of the subsystem.

30. A tester as in claim 21, wherein each timing generator comprises a programmable event calculator which includes an ALU and a register file, for producing event sequences for the plurality of contact points of the DUT.

31. A tester as in claim 30, wherein each timing generator further comprises a context manager which operates during testing to enable conditional execution of instructions.

32. A tester for testing a device under test (DUT) having a plurality of contact points for accessing circuitry inside the DUT, the tester comprising:

a plurality of timing generators producing event sequences for the plurality of contact points of the DUT, each timing generator being associated with a respective contact point of the DUT;

a communication network allowing timing generators associated with different contact points to exchange data, for producing the event sequences; and a reconfigurable allocator unit selectively associating respective timing generators of the plurality of timing generators to respective contact points of the plurality of contact points, so that associations between timing generators and contact points are reassignable under software control.

33. A tester for testing a device under test (DUT) having a plurality of contact points for accessing circuitry inside the DUT, the tester comprising:

a plurality of timing generators, each timing generator including a programmable event calculator which includes a ALU and a register file, for producing event sequences for the plurality of contact points of the DUT, wherein each timing generator is associated with a respective contact point of the DUT; and a communication network allowing timing generators associated with different contact points to exchange data.

34. A tester for testing a device under test (DUT) having a plurality of contact points for accessing circuitry inside the DUT, the tester comprising:

a plurality of timing generators producing event sequences for the plurality of contact points of the DUT; and a reconfigurable allocator unit selectively associating respective timing generators of the plurality of timing generators to respective contact points of the plurality of contact points, so that associations between timing generators and contact points are reassignable under software control, wherein the timing generators are divided into a plurality of subsets of timing generators, each subset including at least one timing generator, the contact points are divided into a plurality of subsets of contact points, each subset including at least one contact point, each subset of timing generators is associated with a subset of contact points, and for each subset of timing generators, the reconfigurable allocator unit selectively associates each timing generator of the subset of timing generators to a respective contact point of the associated subset of timing points, so that associations between timing generators and contact points are reassignable under software control.

35. A tester for testing a device under test (DUT) having a plurality of contact points for accessing circuitry inside the DUT, the tester comprising:
- a plurality of timing generators producing event sequences for the plurality of contact points of the DUT;
- a reconfigurable allocator unit selectively associating respective timing generators of the plurality of timing generators to respective contact points of the plurality of contact points, so that associations between timing generators and contact points are reassignable under software control;
- a system controller providing a system clock signal and instructions based on a test program; and
- a global instruction broadcast network broadcasting the system clock signal and instructions to the plurality of timing generators, so that the event sequences are produced in accordance with the test program.

36. A tester for testing a device under test (DUT) having a plurality of contact points for accessing circuitry inside the DUT, the tester comprising:
- a plurality of timing generators producing event sequences for the plurality of contact points of the DUT;
- a reconfigurable allocator unit selectively associating respective timing generators of the plurality of timing generators to respective contact points of the plurality of contact points, so that associations between timing generators and contact points are reassignable under software control; and
- a communication network allowing timing generators associated with different contact points to exchange data, for producing the event sequences.

37. A tester as in claim 36, wherein said data includes data related to, and not related to, a current state of a contact point under test.

38. A tester for testing a device under test (DUT) having a plurality of contact points for accessing circuitry inside the DUT, the tester comprising:
- a plurality of timing generators producing event sequences for the plurality of contact points of the DUT, wherein each timing generator comprises a programmable event calculator which includes a ALU and a register file, for producing event sequences for the plurality of contact points of the DUT; and
- a reconfigurable allocator unit selectively associating respective timing generators of the plurality of timing generators to respective contact points of the plurality of contact points, so that associations between timing generators and contact points are reassignable under software control.

39. A tester as in claim 38, wherein each timing generator further comprises a context manager which operates during testing to enable conditional execution of instructions.

40. A tester for testing a device under test (DUT) having a plurality of contact points for accessing circuitry inside the DUT, the tester comprising:
- a plurality of timing generator modules producing event sequences for the plurality of contact points of the DUT, wherein
- each timing generator module has at least one subsystem which is within, or connected to, the timing generator module,
- each timing generator module includes a multi-clock generator receiving a system clock signal and generating a plurality of local clock signals from the system clock signal, the plurality of local clock signals including a local clock signal for regulating each subsystem of said at least one subsystem of the timing generator module at substantially the highest rate of operation of the subsystem,
- each timing generator includes a memory storing instructions, and
- each timing generator includes a memory controller for writing instructions to said memory and
    retrieving designated instruction sequences from said memory for broadcast within the timing generator module.

41. A tester as in claim 40, wherein, for each timing generator module, the local clock signals produced by the multi-clock generator are at a clock rate which is greater than, or equal to, the clock rate of the system clock signal.

42. A tester as in claim 40, wherein
- each timing generator module includes a plurality of timing generators, for producing the event sequences, and
- the tester further comprises a reconfigurable allocator unit selectively associating timing generators to contact points, so that associations between timing generators and contact points are reassignable under software control.

43. A tester as in claim 40, wherein
- each timing generator module includes a plurality of timing generators, and each timing generator is associated with a respective contact point of the DUT, and
- the tester further comprises a communication network allowing timing generators associated with different contact points to exchange data, for producing the event sequences.

44. A tester as in claim 43, wherein said data includes data related to, and not related to, a current state of a contact point under test.

45. A tester as in claim 40, wherein
- each timing generator module includes a plurality of timing generators, for producing the event sequences, and
- each timing generator comprises a programmable event calculator which includes a ALU and a register file, for producing event sequences for the plurality of contact points of the DUT.

46. A tester as in claim 45, wherein each timing generator further comprises a context manager which operates during testing to enable conditional execution of instructions.

47. A tester as in claim 33, wherein each timing generator further comprises a context manager which operates during testing to enable conditional execution of instructions.

48. A tester as in claim 47, wherein said data includes data related to, and not related to, a current state of a contact point under test.

49. A tester for testing a device under test (DUT) having a plurality of contact points for accessing circuitry inside the DUT, the tester comprising:
- a plurality of timing generators, each timing generator including a programmable event calculator which includes a ALU and a register file, for producing event sequences for the plurality of contact points of the DUT; and
- a reconfigurable allocator unit selectively associating respective timing generators of the plurality of timing generators to respective contact points of the plurality of contact points, so that associations between timing generators and contact points are reassignable under software control.

50. A tester for testing a device under test (DUT) having a plurality of contact points for accessing circuitry inside the DUT, the tester comprising:

a system controller providing a system clock signal and instructions based on a test program;

a global instruction broadcast network broadcasting the system clock signal and instructions;

a plurality of timing generator building blocks each receiving the broadcasted system clock signal and instructions from the global instruction broadcast network, each timing generator building block including a plurality of timing generator modules, each timing generator module having at least one subsystem which is within, or connected to, the timing generator module, each timing generator module including a multi-clock generator generating a plurality of local clock signals from the system clock signal, the plurality of local clock signals including a local clock signal for regulating each subsystem of said at least one subsystem of the timing generator module at substantially the highest rate of operation of the subsystem, and a plurality of timing generators, each timing generator including a programmable event calculator having an ALU and a register file, for producing event sequences for the plurality of contact points of the DUT;

a reconfigurable allocator unit selectively associating respective timing generators to respective contact points, so that associations between timing generators and contact points are reassignable under software control; and a communication network allowing timing generators associated with different contact points to exchange data, so that event sequences for the plurality of contact points of the DUT are produced in accordance with the test program.

\* \* \* \* \*